(12) United States Patent
Manganaro

(10) Patent No.: US 6,809,589 B2
(45) Date of Patent: Oct. 26, 2004

(54) LOW VOLTAGE LARGE SWING/HIGH LINEARITY ANALOG BUFFER WITH SERVO AMPLIFIER AND FEEDBACK LOOP

(75) Inventor: Gabriele Manganaro, Boxborough, MA (US)

(73) Assignee: Engim, Inc., Acton, MA (US)

(*) Notice: Subject to any disclaimer, the term of this patent is extended or adjusted under 35 U.S.C. 154(b) by 0 days.

(21) Appl. No.: 10/460,066

(22) Filed: Jun. 12, 2003

(65) Prior Publication Data

US 2004/0008017 A1 Jan. 15, 2004

Related U.S. Application Data

(60) Provisional application No. 60/389,059, filed on Jun. 13, 2002.

(51) Int. Cl.[7] ............................... H03F 3/45; H03F 1/36
(52) U.S. Cl. ......................... 330/260; 330/85; 330/110
(58) Field of Search ............................ 330/260, 85, 110

(56) References Cited

U.S. PATENT DOCUMENTS

| | | | |
|---|---|---|---|
| 4,739,281 A | 4/1988 | Doyle | |
| 5,631,968 A | * 5/1997 | Frey et al. | 381/106 |
| 6,066,985 A | 5/2000 | Xu | |
| 6,232,805 B1 | * 5/2001 | Brandt | 327/108 |
| 6,459,332 B2 | * 10/2002 | Uchida | 327/563 |
| 6,724,169 B2 | * 4/2004 | Majumdar et al. | 318/811 |

OTHER PUBLICATIONS

*Analog Integrated Circuit Design*, David Johns and Ken Martin eds., (John Wiley & Sons Inc.), Chapter 6, pp. 266–268 (1997).

*Analysis and Design of Analog Integrated Circuits*, Paul Gray and Robert G. Meyer eds.,(John Wiley & Sons Inc.), Chapter 4, pp. 336–337 (1993).

* cited by examiner

*Primary Examiner*—Patricia Nguyen
(74) *Attorney, Agent, or Firm*—Hamilton, Brook, Smith & Reynolds, P. C.

(57) ABSTRACT

An analog buffer with low harmonic distortion and low power supply voltage buffers a signal with wide voltage swing. The lower output voltage swing is increased, by adding a voltage level shifter to the feedback path of a servo. The upper output voltage swing is increased by coupling the output load to $V_{dd}$.

27 Claims, 6 Drawing Sheets

LOW VOLTAGE LARGE SWING/HIGH LINEARITY ANALOG BUFFER WITH SERVO AMPLIFIER AND FEEDBACK LOOP

RELATED APPLICATION

This application claims the benefit of U.S. Provisional Application No. 60/389,059, filed on Jun. 13, 2002. The entire teachings of the above application are incorporated herein by reference.

BACKGROUND OF THE INVENTION

An analog buffer is coupled between the source of an input voltage and a load when the source of the input voltage is unable to directly drive an output load. The analog voltage buffer has high input impedance and low output impedance to provide a source and a sink current and supplies an output voltage which tracks the input voltage. A linear transconductor is typically used in an analog voltage buffer to perform linear voltage-to-current conversion. Linear transconductors are typically used in continuous-time filters, tuning circuitry, and phase locked loops.

Figure 1:
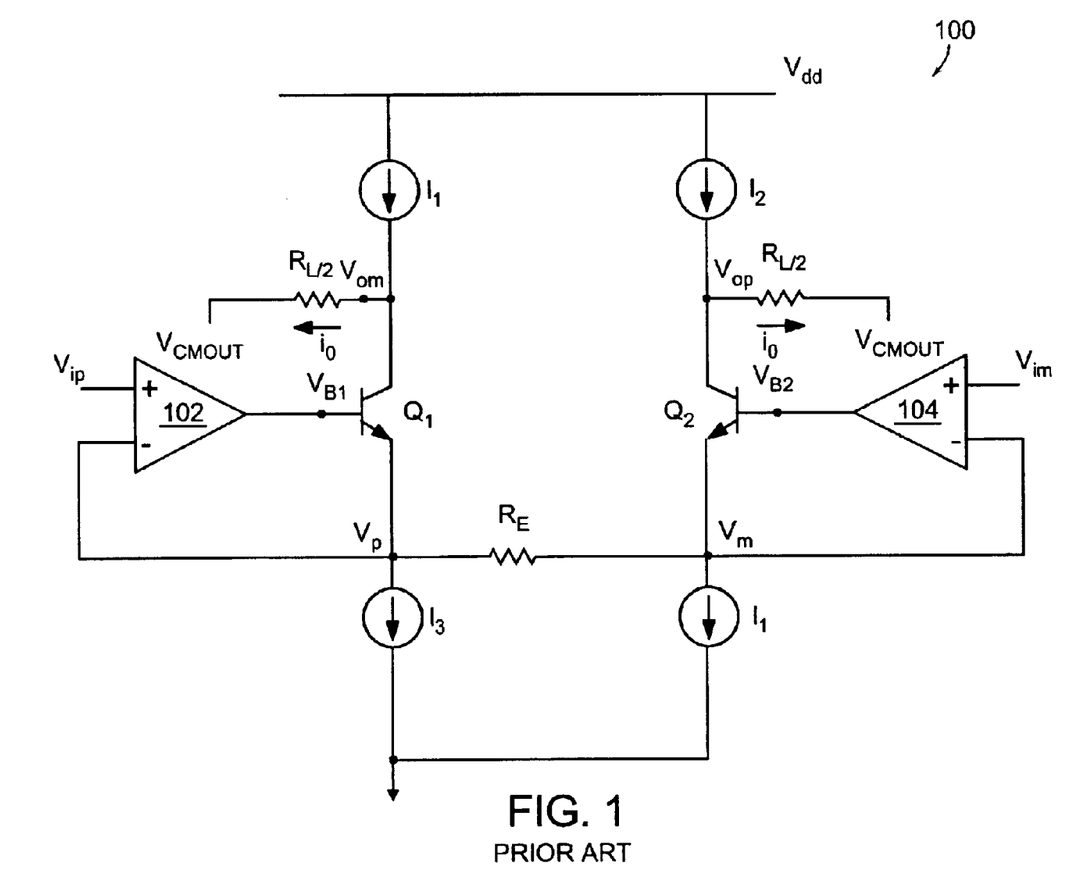
FIG. 1 is a circuit diagram of a prior art analog buffer.

FIG. 1 is a circuit diagram of a prior art differential-mode analog buffer 100. A differential input voltage $V_i$ ($V_{ip}-V_{in}$) is applied to the respective non-inverting inputs of servo amplifiers 102, 103. The analog buffer 100 converts the differential input voltage $V_i$ ($V_{ip}-V_{in}$) to an output current $i_o$ that flows through the output terminals of the analog buffer through the load. The analog buffer 100 includes four constant current sources labeled $I_1$, $I_2$, $I_3$, $I_4$ each constant current source is represented by a symbol having an arrow indicating the direction of the current flow on the input side of the current mirror.

Each of the servo amplifiers 102, 104 has an NPN bipolar transistor in the feedback path between the inverting input and the output. The base of NPN bipolar transistor $Q_1$ in the feedback path of servo amplifier 102 is coupled to the output of the servo amplifier 102 and the emitter is coupled to the non-inverting input of the servo amplifier 102. Constant current source $I_1$ is coupled to the collector of NPN transistor $Q_1$ and constant current source $I_3$ is coupled to the emitter of NPN transistor $Q_1$.

The base of transistor $Q_2$ in the feedback path of servo amplifier 104 is coupled to the output of the servo amplifier 104 and the emitter is coupled to the non-inverting input of the servo amplifier 104. Constant current source $I_2$ is coupled to the collector and constant current source $I_4$ is coupled to the emitter. A linear resistor $R_E$ is coupled between the emitter of transistor $Q_1$ and the emitter of transistor $Q_2$. The load $R_L$ coupled to the differential output $V_o$ ($V_{op}-V_{om}$) of the analog buffer 100 is represented by load resistors $R_L/2$ each coupled between the respective collector of the transistor $Q_1$, $Q_2$ and a common mode output voltage $V_{cmout}$.

A differential analog input voltage $V_i$ ($V_{ip}-V_{im}$) is applied to the analog buffer 100 through the respective non-inverting inputs of the servo amplifiers 102, 104. The corresponding differential output voltage $V_o$ ($V_{op}-V_{om}$) on the collectors of the respective NPN transistors $Q_1$, $Q_2$ tracks the differential input voltage $V_i$ ($V_{ip}-V_{im}$).

If each of the constant current sources $I_1$, $I_2$, $I_3$, $I_4$ supplies a constant current through the range of operation of the circuit, the differential input signal $V_i$ ($V_{ip}-V_{im}$) is essentially equal to the voltage $V$ ($V_p-V_m$) applied across the linear resistor $R_E$. Thus, the voltage $V$ across $R_E$ more or less follows the differential input voltage $V_i$ ($V_{ip}-V_{im}$) dependent on the gain-bandwidth of the feedback loops constituted by the combination of the servo amplifiers 102, 104 and the transistors $Q_1$, $Q_2$. Hence, the resulting output current $i_o=V_i/R_E$ flows through the output terminals. The same signal appears on $V_{op}$, $V_{om}$, but it is 180 degrees out of phase with the signal on the emitter; that is, $V_p$, $V_m$.

However, the output voltage $V_{op}$, $V_{om}$ swing is limited. The lower output swing of $V_{op}$, $V_{om}$ is limited because transistors $Q_2$ and $Q_1$ must always be in the active region to provide the feedback path for the respective servo amplifier so that the feedback loop is closed. In the active region, the base-emitter diodes in transistors $Q_2$ and $Q_1$ are forward biased and the collector-emitter diodes are reverse biased. Thus, with both transistors $Q_1$, $Q_2$ in the active region, there is a common-mode direct current (DC) voltage at $V_{om}$, $V_{op}$ that is at least $V_{be}$ above ground because of the need to keep at least a $V_{be}$ voltage at Vm, Vp to keep transistors $Q_2$ and $Q_1$ forward biased. With low power supply voltages, for example, 2V, a common-mode D.C. voltage of 0.8V is significant.

Figure 2:
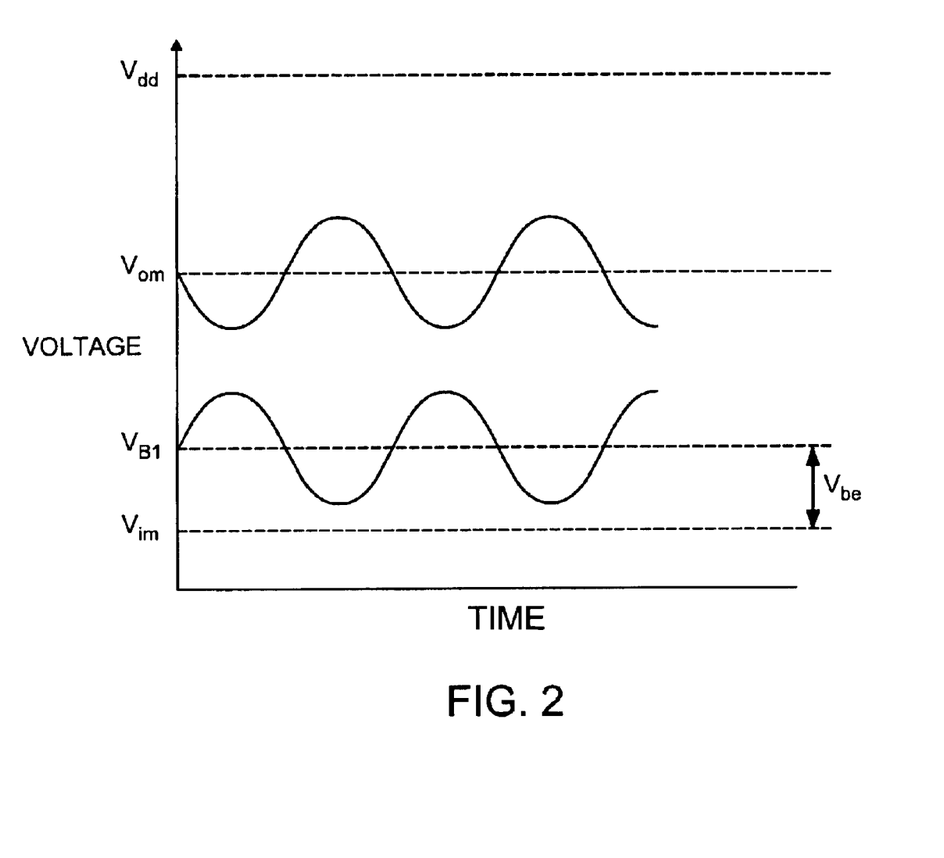
FIG. 2 illustrates the lower output swing limitation of the prior art analog buffer shown in FIG. 1.

FIG. 2 illustrates the lower output swing limitation of the prior art analog buffer shown in FIG. 1. The common mode voltage at $V_{B1}$ is at least $V_{be}$ above the common mode voltage at $V_{ip}$ to keep transistor $Q_2$ in the active region. Thus, the lower output swing of the output signal $V_{om}$ is limited because the output voltage $V_{om}$ must be greater than the voltage at $V_{B1}$ to keep transistor $Q_2$ in the active region.

Returning to FIG. 1, the upper output swing of $V_{op}$, $V_{om}$ is limited because collector currents $I_2$ and $I_1$ must be kept constant. The requirement to keep the collector currents constant is dependent on the implementation of the constant current sources $I_2$, $I_1$, but it generally requires a voltage drop across the constant current sources. Thus, the power supply voltage $V_{dd}$ limits the upper output swing and the feedback path through transistors $Q_1$, $Q_2$ limits the lower output swing. The limitations on the upper and lower output swing results in harmonic distortion of the output signal.

SUMMARY OF THE INVENTION

An analog buffer which offers low harmonic distortion for an output signal with a wide voltage swing and low power supply voltage is presented. The output voltage swing is increased by adding a voltage level shifter to the feedback path of a servo amplifier. The servo amplifier receives an input signal at a first input. A bipolar transistor is coupled to the output of the servo amplifier. The emitter of the bipolar transmitter is coupled through a feedback loop to a second input of the servo amplifier. A voltage level shifter is coupled in the feedback loop and a current source pushes current into the voltage level shifter to cause a voltage shift at the emitter of the bipolar transistor to increase output voltage swing. The voltage shift increases the lower voltage swing. The upper output voltage swing may be increased, by coupling a load between the collector of the bipolar transistor and the upper power supply voltage. The current source maintains a constant voltage at the second input of the servo amplifier through the diode to keep the bipolar transistor in an active region.

The voltage level shifter may be a diode-coupled NPN or PNP transistor or a $V_{be}$ multiplier. The bipolar transistor may be NPN or PNP. The diode may be a diode-coupled NPN bipolar transistor. The current source may be a cascode current mirror. A second current source may be coupled to the collector of the bipolar transistor to center the output voltage swing in the middle of the power supply voltage range.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 3:
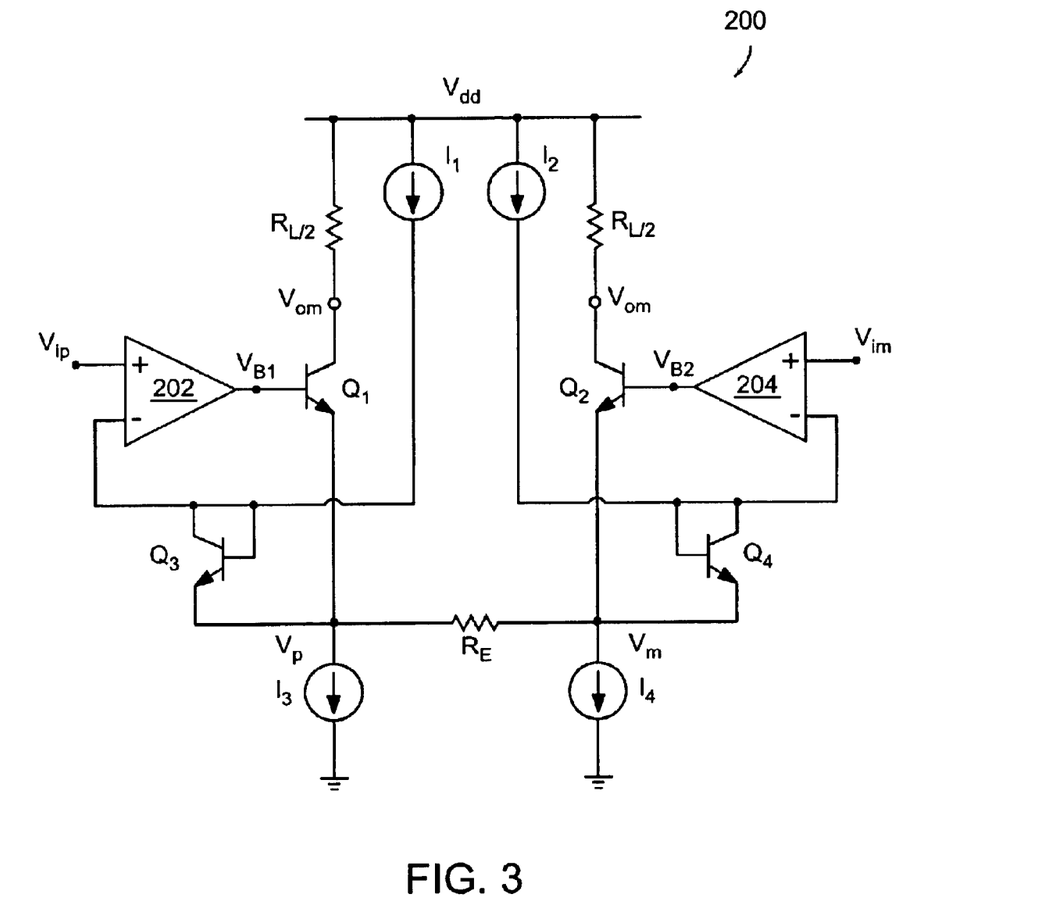
FIG. 3 is a circuit diagram of an analog buffer according to the principles of the present invention.

FIG. 3 is a circuit diagram of a analog buffer 200 according to the principles of the present invention. The analog buffer 200 provides a wider output voltage range than in the prior art circuit shown in FIG. 1. The upper output voltage swing on $V_{om}$, $V_{op}$ is increased by connecting the load $R_L$ between the upper rail $V_{dd}$ and the output terminals $V_{op}$–$V_{om}$. The upper output signal swing can virtually reach $V_{dd}$ without incurring harmonic distortion. The lower output voltage swing on $V_{om}$, $V_{op}$ is increased, by adding diode coupled transistors $Q_3$, $Q_4$ to shift the D.C. common mode voltage at $V_p$, $V_m$ down by $V_{be}$.

The analog buffer 200 includes two servo amplifiers 202, 204 each having a respective diode coupled transistor $Q_3$, $Q_4$ in the feedback/sensing path. A linear resistor $R_E$ is coupled between the emitter of transistor $Q_1$ and the emitter of transistor $Q_2$. The output load $R_L$ is coupled between the respective collector of transistors $Q_1$, $Q_2$ and $V_{dd}$. Transistors $Q_3$ and $Q_4$ are diode coupled by connecting each respective base to the respective collector such that each transistor $Q_3$ and $Q_4$ acts as a diode.

The diode coupled transistors $Q_3$, $Q_4$ act as a common mode D.C. level-shifter between the respective inverting input of servo amplifier 102, 104 and the linear resistor $R_E$. A common mode D.C. voltage of at least $V_{be}$ is provided at the respective non-inverting input of the servo amplifiers 202, 204 by $Q_3$, $Q_4$ to keep $Q_1$, $Q_2$ in the active region of operation.

The analog buffer 200 also includes four constant current sources, each represented by a current source symbol labeled $I_1$, $I_2$, $I_3$, $I_4$. The current sources may simply be individual transistors or they may be more complex. Each current source symbol includes an arrow that indicates the direction of the current flow on the input side of the current mirror. A constant current source $I_1$ provides a constant current to the collector and base of diode coupled transistor $Q_3$ and constant current source $I_2$ provides a constant current to the collector and base of diode coupled transistor $Q_4$. Both constant current sources provide the same current. However, the currents of constant current sources $I_1$, $I_2$ are smaller than constant current sources $I_4$, $I_3$, yet large enough to keep diode coupled transistors $Q_3$ and $Q_4$ in their active region of operation. Thus, transistors $Q_3$, $Q_4$ are kept in the active region of operation with a constant base-emitter $V_{be}$ voltage drop across the base-emitter junction of each transistor $Q_3$, $Q_4$.

A differential input voltage $V_i$ ($V_{ip}$–$V_{im}$) is applied to the non-inverting inputs of the respective servo amplifiers 202, 204. The output voltage $V_o$ ($V_{op}$–$V_{om}$) between the collectors of the respective transistors $Q_1$, $Q_2$ tracks the input voltage $V_i$ ($V_{ip}$–$V_{im}$).

The D.C. voltage shifter constituted by $I_1$, $Q_3$ is part of the feedback/sensing path of the loop through servo amplifier 202, $Q_1$ and $Q_3$. Diode coupled transistor $Q_3$ is coupled between the non-inverting input of servo amplifier 204 and the feedback resistor $R_E$, with its base and collector coupled to the non-inverting input of servo amplifier 204 and its emitter coupled to linear resistor $R_E$. The constant current source $I_1$ pushes current into the diode-coupled transistor $Q_3$ to cause a voltage shift at the emitter of the bipolar transistor $Q_1$ to increase the lower output voltage swing.

Similarly, the D.C. voltage shifter constituted by $I_2$, $Q_4$ is part of the feedback/sensing path of the loop through servo amplifier 204, $Q_2$ and $Q_4$. Neither of the D.C. voltage shifters are part of the forward path of the respective feedback/sensing path loop. Thus, any harmonic distortion introduced by the DC voltage shifter is not reduced by the respective feedback loop and may affect the voltage across $R_E$ and hence the output signal. However, the constant current sources $I_1$, $I_2$ are insensitive to the signal across $R_E$, and the current flowing in the non-inverting inputs of the servo amplifiers 202, 204 is negligible compared to constant current sources $I_1$, $I_2$. Thus, the emitter current of each diode-coupled transistor $Q_3$, $Q_4$ is constant, and so is the voltage level shift. Hence, no harmonic distortion is introduced.

The D.C. voltage level shift provided by the voltage level shifter comprising constant current source $I_1$ and transistor $Q_3$ is approximately equal to the base-emitter voltage ($V_{be}$) drop across transistor $Q_1$. Consequently, the common mode D.C. base voltage of $Q_1$ is approximately 0.7~0.8V lower than in prior art circuit described in conjunction with FIG. 1. This shift in the common mode D.C. base voltage allows the lower output voltage swing on $V_o$ ($V_{op}$–$V_{om}$) to swing 0.7V lower than in the prior art circuit shown in FIG. 1.

Thus, the voltage swing is wider than in the prior art circuit described in conjunction with FIG. 1.

In an alternate embodiment, the circuit can allow the same output voltage swing as in the prior art circuit but at a reduced power supply voltage. A number of modifications can be made to the voltage level shifters $I_1$, $Q_3$ and $I_2$, $Q_4$. For example, $Q_3$ and $Q_4$ can be substituted by $V_{be}$-multipliers well known to those skilled in the art to obtain larger voltage level shifts. Alternatively, a switched capacitor level shifter well known to those skilled in the art can be used if the buffer is embedded into a discrete-time signal processing system. Moreover, a complementary version of this embodiment can be provided, by using a grounded load $R_L$ and substituting PNP bipolar transistors for the NPN transistors.

Figure 4:
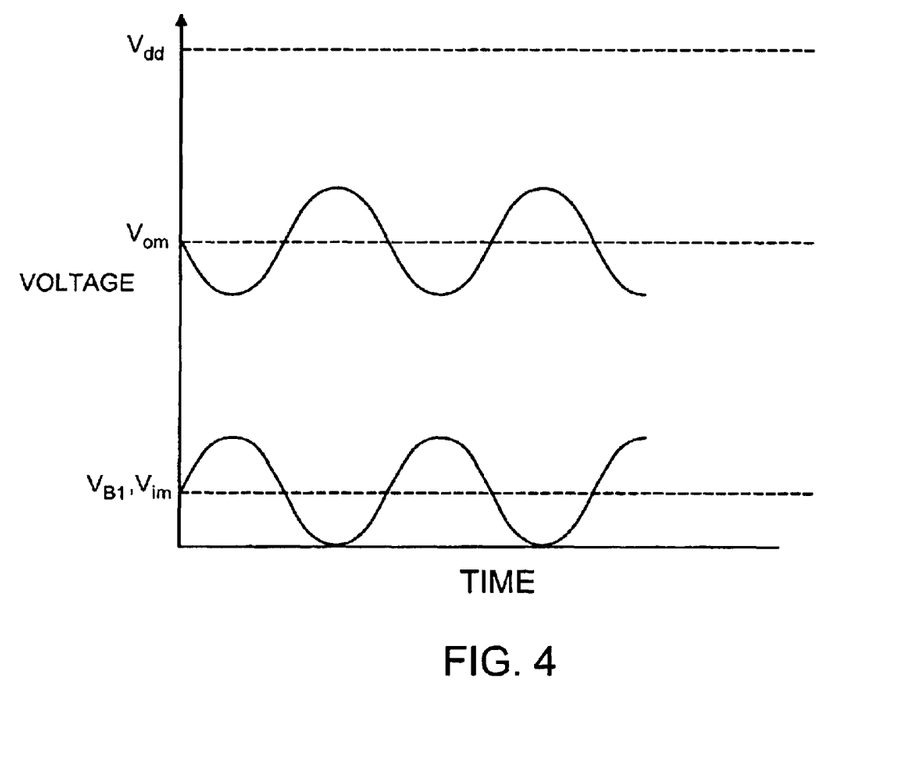
FIG. 4 illustrates the increased lower output swing limitation of the prior art analog buffer shown in FIG. 1.

FIG. 4 illustrates the lower output swing limitation of the prior art analog buffer shown in FIG. 1. The common mode voltage at $V_{B1}$ is the same as the common mode voltage at $V_{ip}$. The voltage level shifter maintains the common voltage at the non-inverting input of the servo amplifier at $V_{be}$ above the common mode voltage of $V_{ip}$ to keep transistor $Q_2$ in the active region. Thus, the lower output swing of the output signal $V_{om}$ is increased by Vbe.

Figure 5:
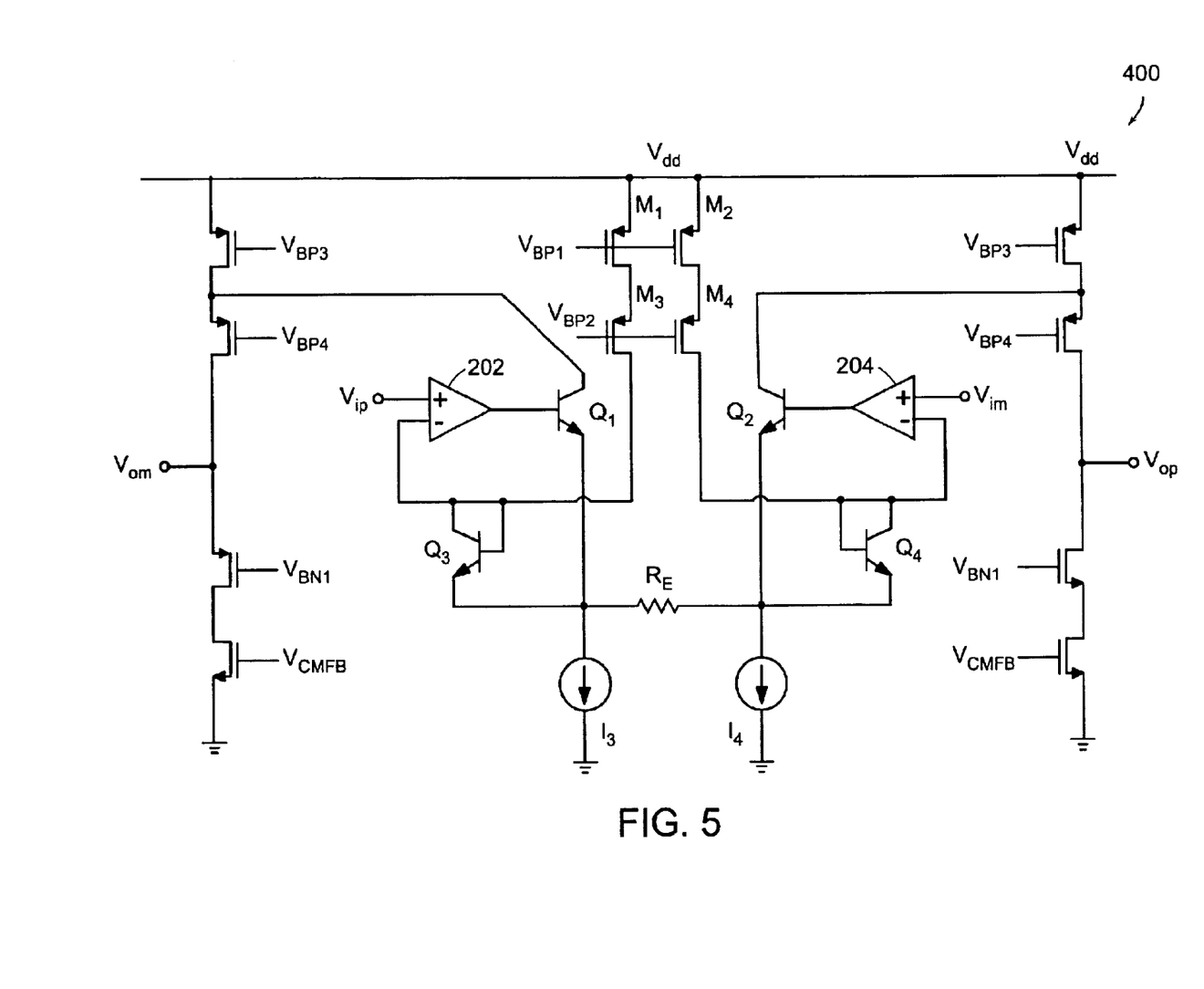
FIG. 5 is a circuit diagram of an analog buffer shown in FIG. 3 including a linear transconductor.

FIG. 5 is a circuit diagram of an analog buffer shown in FIG. 3 including a linear transconductor. The constant current sources $I_1$, $I_2$ shown in FIG. 3 are implemented as cascode current mirrors well-known to those skilled in the art. The cascode mirrors include PMOS transistors M1, M2, M3, M4 with biasing voltages $V_{BP1}$, $V_{BP2}$. For example, with a $V_{dd}$ voltage of 3V, biasing voltage $V_{BP1}$ is about 2V and biasing voltage $V_{BP2}$ is about 1.7V.

PMOS transistors M1, M3 provide a constant current to the collector and base of transistor $Q_3$. PMOS transistors M2, M4 provide a constant current to the collector and base of transistor $Q_4$. The drain currents of transistors M1, M2, M3 and M4 are smaller than constant current sources $I_4$, $I_3$ yet large enough to keep transistors $Q_3$ and $Q_4$ in their active regions of operation.

A folded cascaded output stage is coupled to the linear transconductor 400 allowing an additional voltage shift in addition to the voltage shift provided by diode coupled transistors $Q_3$, $Q_4$ described in conjunction with FIG. 3. Biasing voltages $V_{BP3}$, $V_{BP4}$ and $V_{BN1}$ are selected to bias the PMOS and NMOS output transistors so that the D.C. common mode output voltage is at about $V_{dd}/2$. This additional voltage shift by the folded cascaded output stage provides a common mode output voltage centered between the power supply levels. The output common mode is stabilized through voltage regulation at the terminal denoted by $V_{CMFB}$.

The analog buffer has been described for a differential mode input and differential output signal using NPN transistors. In an alternative embodiment, the analog buffer can be implemented for single ended input and output signals.

Figure 6:
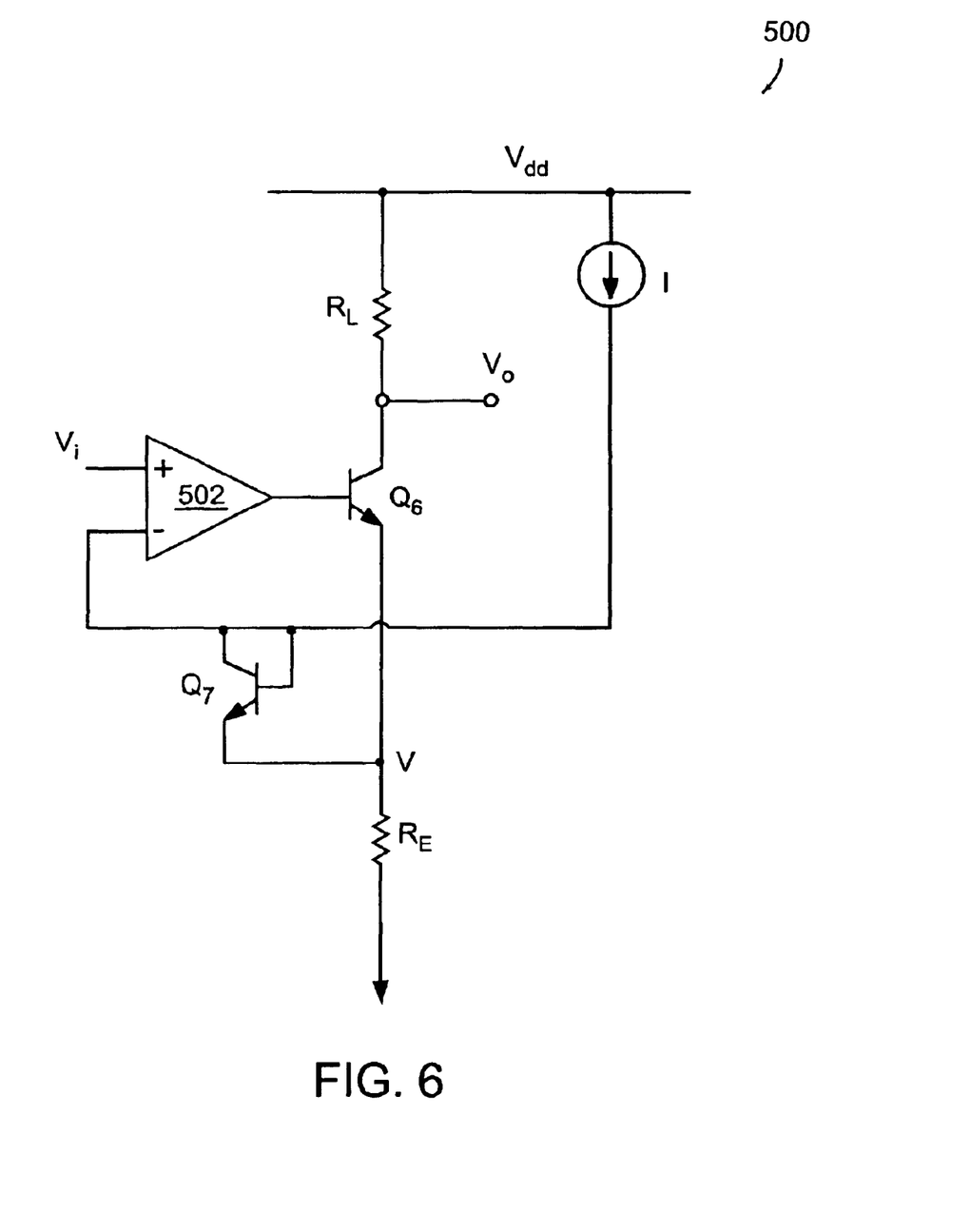
FIG. 6 is a circuit diagram of a single ended embodiment of the analog buffer.

FIG. 6 is a circuit diagram of a single ended embodiment of the analog buffer. The upper output voltage swing is increased, by connecting the load $R_L$ between the upper rail $V_{dd}$ and the output terminal $V_o$. This allows the upper output voltage swing to virtually reach $V_{dd}$.

The lower voltage output voltage swing is increased, by adding diode-coupled transistor Q7 to shift the DC common mode voltage at V down by $V_{be}$. A common mode D.C. voltage of at least $V_{be}$ is provided at the respective non-inverting input of the servo amplifier 502 by $Q_7$. With a common mode D.C. voltage of at least $V_{be}$, the common mode D.C. voltage level at $V_p$ and the corresponding A.C. signal on $V_o$ can reach ground; that is, the $V_p$ common mode D.C. voltage level is shifted down by $V_{be}$ resulting in a corresponding increase in the lower output voltage swing.

A constant current source I provides a constant current to the collector and base of transistor $Q_7$. Transistor $Q_7$ acts as a level shifter between the inverting input of servo amplifier 502 and the resistor $R_E$. The constant current source I pushes current into the diode-coupled transistor $Q_3$ to cause a voltage shift at the emitter of the bipolar transistor $Q_7$ to increase the lower output voltage swing.

While this invention has been particularly shown and described with references to preferred embodiments thereof, it will be understood by those skilled in the art that various changes in form and details may be made therein without departing from the scope of the invention encompassed by the appended claims.

What is claimed is:

1. An analog buffer comprising:
   a servo amplifier which receives an input signal at first input;
   a bipolar transistor at the output of the servo amplifier, the emitter of the bipolar transistor coupled through a feedback loop to a second input of the servo amplifier;
   a voltage level shifter coupled in the feedback loop; and
   a current source providing current to the voltage level shifter to cause a voltage shift at the emitter of the bipolar transistor to increase output voltage swing.

2. The analog buffer of claim 1 wherein the lower voltage swing is increased.

3. The analog buffer of claim 2 wherein a load is coupled between the collector of the bipolar transistor and the upper power supply voltage to increase the upper output voltage swing.

4. The analog buffer of claim 1 wherein the current source maintains a constant voltage at the second input of the servo amplifier through the diode to keep the bipolar transistor in an active region.

5. The analog buffer of claim 1 wherein the bipolar transistor is NPN.

6. The analog buffer of claim 1 wherein the bipolar transistor is PNP.

7. The analog buffer of claim 1 wherein the voltage level shifter is a diode-coupled bipolar transistor.

8. The analog buffer of claim 7 wherein the bipolar transistor is NPN.

9. The analog buffer of claim 7 wherein the bipolar transistor is PNP.

10. The analog buffer of claim 1 wherein the voltage level shifter is a $V_{be}$ multiplier.

11. The analog buffer of claim 1 wherein the voltage level shifter is a switched capacitor level shifter.

12. The analog buffer of claim 1 wherein the current source is a cascode current mirror.

13. The analog buffer of claim 1 further comprising:
   a second current source coupled to the collector of the bipolar transistor to center the output voltage swing in the middle of the power supply voltage range.

14. A method for buffering an input signal comprising:
   receiving an input signal at first input of a servo amplifier;
   coupling the emitter of a bipolar transistor through a feedback loop to a second input of the servo amplifier;
   coupling a diode in the feedback loop; and
   pushing current into the diode to cause a voltage shift at the emitter of the bipolar transistor to increase output voltage swing.

15. The method of claim 14 wherein the lower voltage swing is increased.

16. The method of claim 15 further comprising:
   coupling a load between the collector of the bipolar transistor and the upper power supply voltage to increase the upper output voltage swing.

17. The method of claim 14 wherein the bipolar transistor is NPN.

18. The method of claim 14 wherein the bipolar transistor is PNP.

19. The method of claim 14 wherein the voltage level shifter is a diode-coupled bipolar transistor.

20. The method of claim 19 wherein the bipolar transistor is NPN.

21. The method of claim 19 wherein the bipolar transistor is PNP.

22. The method of claim 14 wherein the voltage level shifter is a $V_{be}$ multiplier.

23. The method of claim 14 wherein the voltage level shifter is a switched capacitor level shifter.

24. The method of claim 14 wherein the current is pushed by a cascode current mirror.

25. The method of claim 14 wherein a constant voltage is maintained at the second input of the servo amplifier through the diode to keep the bipolar transistor in an active region.

26. The method of claim 14 further comprising:
centering the output voltage swing in the middle of the power supply voltage range.

27. A analog buffer comprising:
means for receiving an input signal at first input of a servo amplifier;
means for coupling the emitter of a bipolar transistor through a feedback loop to a second input of the servo amplifier;
means for coupling a diode in the feedback loop; and
means for pushing current into the diode to cause a voltage shift at the emitter of the bipolar transistor to increase output voltage swing.

* * * * *